United States Patent [19]

Wu

[11] Patent Number: 5,572,208

[45] Date of Patent: Nov. 5, 1996

[54] APPARATUS AND METHOD FOR MULTI-LAYERED DECODING OF VARIABLE LENGTH CODES

[75] Inventor: Druong-Yow Wu, Hsin chu, Taiwan

[73] Assignee: Industrial Technology Research Institute, Hsinchu, Taiwan

[21] Appl. No.: 282,617

[22] Filed: Jul. 29, 1994

[51] Int. Cl.⁶ .................................................. H03M 7/40
[52] U.S. Cl. ................................... 341/67; 341/106
[58] Field of Search .................................. 341/67, 106, 65

[56] References Cited

U.S. PATENT DOCUMENTS

| | | | |
|---|---|---|---|
| 3,883,847 | 5/1975 | Frank | 341/65 |
| 4,593,267 | 6/1986 | Kuroda et al. | 341/67 |
| 4,616,211 | 10/1986 | Ross et al. | 341/67 |
| 4,899,149 | 2/1990 | Kahan | 341/67 |
| 5,032,838 | 7/1991 | Murayama et al. | 341/67 |
| 5,034,742 | 7/1991 | Bond et al. | 341/67 |
| 5,173,695 | 12/1992 | Sun et al. | 341/67 |
| 5,428,356 | 6/1995 | Ozaki | 341/67 |
| 5,488,366 | 1/1996 | Wu | 341/67 |

*Primary Examiner*—Marc S. Hoff
*Attorney, Agent, or Firm*—Bo-In Lin

[57] ABSTRACT

A multi-level decoder and design method are used to decode an ordered sequence of incoming binary bit-stream in serial containing a plurality of variable length codewords with a maximum codeword length of M. The decoder includes a serial to parallel converter and shfiter for receiving the incoming bit stream, and for receiving a shift-count for shifting and converting the shift-count number of bits for adding to a parallel data record. The decoder further includes a dictionary databank which includes at least two dictionary tables for listing a plurality of standard codewords wherein each of the dictionary tables having a bit-length less than M. The decoder further includes a decoding processor for decoding the parallel data record by utilizing the dictionary databank and to generate the shift-count as an input to the serial to parallel converter and shifter.

7 Claims, 8 Drawing Sheets

APPARATUS AND METHOD FOR MULTI-LAYERED DECODING OF VARIABLE LENGTH CODES

BACKGROUND OF THE INVENTION

1. Field of the Invention

This invention relates generally to an apparatus and method for decoding a stream of input codewords in a high speed data transmission system. More particularly, this invention relates to an apparatus and method for decoding an input stream of variable-length encoded codewords by the use multi-layered parallel processing decoding system to expedite the decoding process while reduce the data storage memory requirement.

2. Description of the Prior Art

The speed of decoding and the complexity of the decoding devices utilized to perform the task of real-time high-speed decoding are two major concerns in the development and application of modern communication and computer technology. As larger volume of data, often in the form of binary bits, are being electronically transmitted, stored and later retrieved, these binary bits are often encoded, i.e., compressed into codewords, for the purposes of accelerating the speed of transmission and for saving the memory space for data storage. These encoded codewords must often be decoded, i.e., decompressed into their original full-length bit strings, either for display or to be further processed. The decoding tasks can be very complicate especially in the case when the a variable length decoding has to be performed when the original bit streams are being encoded into codewords of variable lengths. The complexity arises due to the facts that since each codeword has no fixed length, a decoder must determine not only the codewords but also the determination must be made without first knowing the length of each codeword.

Variable length coding is a technique often applied for lossless data compression wherein a plurality of fixed-length data are converted into codewords of variable lengths. In general, the lengths of the codewords are chosen so that the shorter codewords are used to represent the more frequently occurring data. By properly assigning the variable length codewords to the library for all the possible combinations of codewords, very efficient encoding and decoding processes can be achieved. Huffman coding technique is the most well known and commonly used method to construct a minimum redundant variable length code as a lookup table for encoding and decoding. For that reason, an effective decoding technique which is capable of achieving the processing time-saving for a decoder and to reduce the memory requirements and circuit complexity become very important in the development and application of modern communication and computer technology.

The most straightforward way of carrying out the task of variable length decoding is by the use of a serial variable length decoding method. It examines one bit at a time for determining if a codeword is found. One more bit is added to the bit string if the examined bit-string does not constitute a codeword according to a codeword table. This process is repeated one bit at a time until a codeword is found. Then the same process is performed for next following codeword. This process is simple and straightforward but is too slow to meet the high speed real-time requirement.

A parallel variable length decoder may be used to increase the speed of the decoding process. The decoder is designed to comprise a table in its read only memory (ROM) which contains all the symbols for the codewords to be determined. The decoder then read M-bit from the input bit stream where M is the maximum codeword length. This M-bit input string is then compared with each word in the symbol table. Since, the fixed length bit-string read from the input data stream equals to the maximum codeword length, the actual codeword length information as found is used to define the beginning point of next following codeword in the input data stream. This method has the disadvantage that when the maximum codeword length, i.e., M, is a large number, then the symbol table which has a table length of $2^M$ in the read only memory (ROM) may become too big and occupy too much memory space. The original purpose of saving data storage space by the use of encoding techniques may be defeated when the symbol exceeds a certain limit.

Frank discloses in U.S. Pat. 3,883,847 entitled "Uniform Decoding of Minimum Redundancy Codes" (Issued on May 13, 1975) an apparatus for decoding an ordered sequence of variable length input binary codewords each of these codewords is associated with a symbol in an N-symbol alphabet table. The apparatus receives a fixed-length sample of an input stream consisting of butted together variable length codewords. The length of the received fixed-length symbol is chosen to be less than the maximum codeword length. Each of these samples is used to derive an address defining a location in a memory where an indication of the decoded output symbol is stored along with an indication of the actual length of the codeword corresponding to the output symbol. The decoding apparatus includes a memory hierarchy which includes a primary table and a plurality of secondary tables for storing the information of the N-symbol alphabet table. The received fixed-length bit string is first compared with the primary table for a determination of a codeword. If a codeword is not found, then the bit string is compared with the bit patterns included in the secondary tables.

By the use of the memory hierarchy including the primary and the secondary tables, Frank's decoder is able to reduce the memory required to carry out the variable length decoding. The memory used for storing the alphabet table is smaller with the use of the primary and secondary tables. However, since the shift transfer from the input register is executed by a fixed sequence of clock signals, Frank's decoder suffers a major disadvantage that the operation speed of the decoder is too slow for a modern system implementation. The shift operation alone would take up several clock cycles which would be totally unacceptable for the purpose of modern high speed data processing.

Sun et al. discloses in another U.S. Pat. 5,173,695 entitled 'High Speed Flexible Variable Length Decoder' (issued on Dec. 22, 1992) a variable length decoder which receives a bit stream into a buffer first. The decoder then reads out in parallel sequences equal in length to the maximum length codeword. These sequences of fixed length bit-strings are then read into cascaded latches. The cascaded sequences in both latches are input to a barrel shifter which provides from its multiple bit input, a sliding decoding window to a table-lookup memory device. A control signal directly shifts the position of the decoding window of the barrel shifter as each codeword is detected. To detect each codeword, the initial bits in the decoding window are compared with the codeword entries in the table lookup memory. when a codeword is detected, the corresponding stored codeword length is accumulated with previously accumulated codeword lengths to produce the control signal which directly shifts the decoding window by the number of bits in the decoded word. When all the bits in the first latch have been decoded, the next bit sequence in the buffer is input to the second latch while the previous bit sequence in the second latch is transferred to the first latch. The decoding window is then adjusted to the beginning of the next uncoded sequence.

Even that the decoder as disclosed by Sun et al. provides a faster decoding process wherein the detection of a code word is carried by comparing a plurality bits read into the first latch and that stored in the table-lookup memory in every time cycle, the decoder as disclosed by Sun et al. suffers the disadvantage that the lookup table memory for storing all the codewords may becomes quite large and occupies a large amount of memory space when the maximum length of the codeword becomes a great number.

Furthermore, the Barrel shifter used by Sun et al. has to handle the shift of a maximum number of bits up to M bits, i.e., the maximum length of the codeword. Again if the maximum length of the codeword becomes large, the hardware used to implement the Barrel shifter as that used by Sun would become quite voluminous. As it will explained below, the size of a Barrel Shifter is proportional to $M^2$. It would become a major hindrance in reducing the size of the decoder for its implementation in a portable communication or computing apparatus.

Therefore, there is still a need in the art of variable length decoding to provide an apparatus and method such that the decoding process can be expeditiously performed with high speed in order to satisfy the real time data processing requirements. Meanwhile, for variable length decoding which involves codewords of greater length, there is a need to reduce the memory requirement and the circuit complexity whereby the decoder can be conveniently and economically employed in a more efficient manner to broader variety of applications.

SUMMARY OF THE PRESENT INVENTION

It is therefore an object of the present invention to provide a variable length decoding apparatus and method to overcome the aforementioned difficulties encountered in the prior art.

Specifically, it is an object of the present invention to provide a variable length decoding apparatus and method wherein a serial to parallel converting and shifting means such as a Barrel Shifter is used whereby the decoding speed is improved.

Another object of the present invention is to provide a variable length decoding apparatus and method wherein a dictionary means including at least two standard codeword tables with bit-length less than the maximum codeword length are used to reduce the memory storage requirements.

Another object of the present invention is to provide a variable length decoding apparatus and method wherein the decoding process is performed by simultaneous comparisons made between the encoded words with at least two standard codeword tables in parallel such that the decoding speed can be improved.

Another object of the present invention is to provide a variable length decoding apparatus and method wherein the size of a Barrel shifter used for serial to parallel converting and shifting can be reduced by reducing the maximum shifts required as a consequence of the use of at least two standard codeword tables in the decoding process.

Briefly, in a preferred embodiment, the present invention comprises an apparatus for decoding an ordered sequence of incoming binary bit-stream in serial containing a plurality of variable length codewords with a maximum codeword length of M. The decoding apparatus comprises a serial to parallel converting and shifting means for receiving the incoming bit stream, and for receiving a shift-count for shifting and converting the shift-count number of bits for adding to a parallel data record. The decoding apparatus further comprises a dictionary means including at least two dictionary tables for listing a plurality of standard codewords wherein each of the dictionary tables having a bit-length less than M. The decoding apparatus further comprises a decoding means for decoding the parallel data record by utilizing the dictionary means and to generate the shift-count as an input to the serial to parallel converting and shifting means.

It is an advantage of the present invention that the it provides a variable length decoding apparatus and method wherein a serial to parallel converting and shifting means such as a Barrel Shifter is used whereby the decoding speed is improved.

Another advantage of the present invention is that it provides a variable length decoding apparatus and method wherein a dictionary means including at least two standard codeword tables with bit-length less than the maximum codeword length are used to reduce the memory storage requirements.

Another advantage of the present invention is that it provides a variable length decoding apparatus and method wherein the decoding process is performed by simultaneous comparisons made between the encoded words with at least two standard codeword tables in parallel such that the decoding speed can be improved.

Another advantage of the present invention is that it provides a variable length decoding apparatus and method wherein the size of a Barrel shifter used for serial to parallel converting and shifting can be reduced by reducing the maximum shifts required as a consequence of the use of at least two standard codeword tables in the decoding process.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
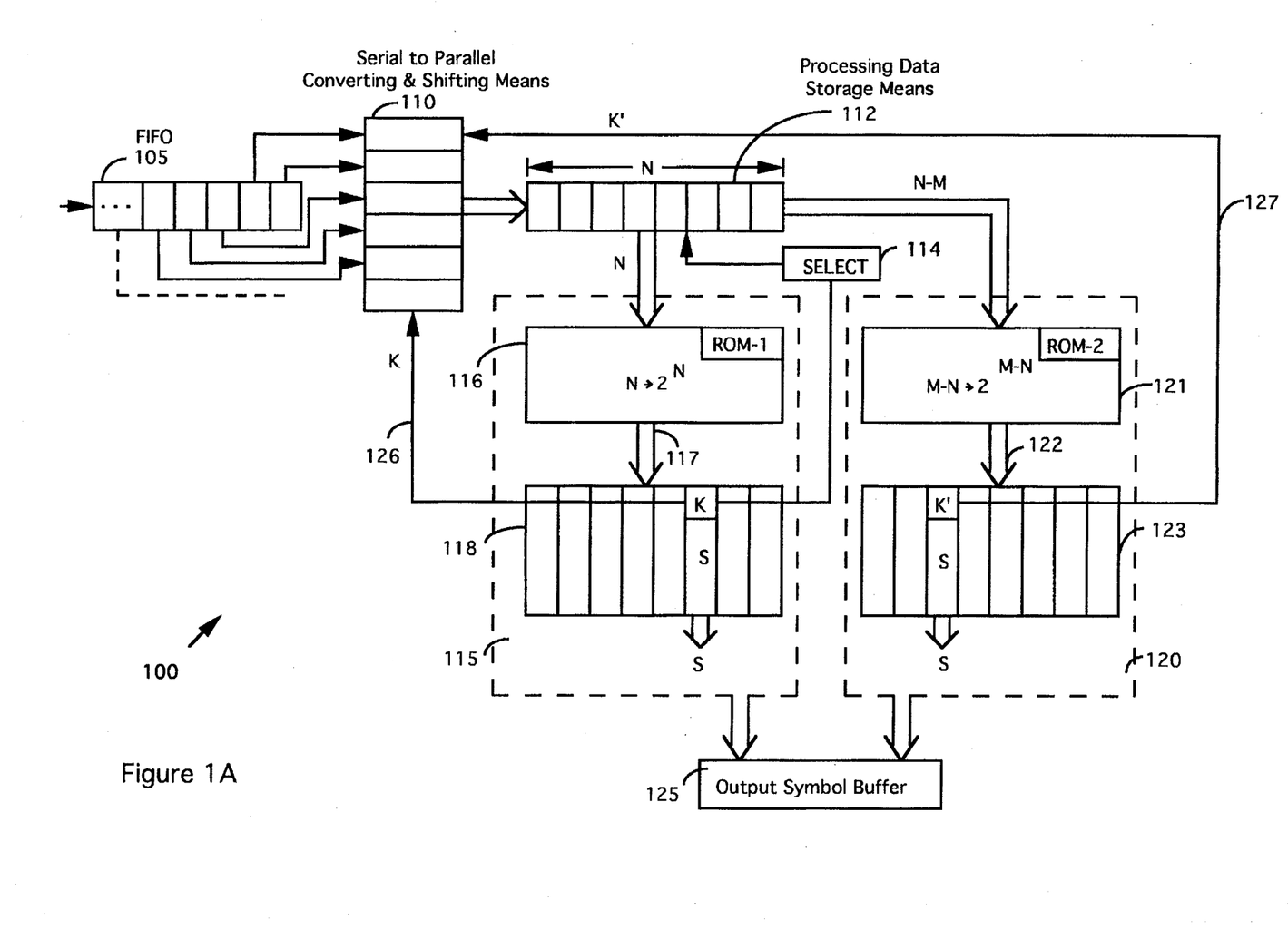
FIG. 1A is a functional block diagram of a decoding system in accordance with the present invention.

FIG. 1A is a functional block diagram which shows a variable length decoding system 100 according to the present invention. The decoding system 100 receives a serial bit stream into a input data buffer 105 which typically is a data register capable of temporarily storing the incoming bit stream while waiting in definite order, i.e., first in first out (FIFO), to be further processed whereby the incoming bit stream is decoded according to a standard codeword 'dictionary' into a plurality of output symbols wherein the maximum codeword length is M.

The incoming bit stream is inputted from the input data buffer 105 to a serial to parallel converting and shifting means 110 to convert the serial bits stored in the input data buffer 105 into a N-bit parallel format, where the integer N is less than or equal to M (the maximum length of the codewords), i.e., N≦M. The converting and shifting means 110 also shifts the serial bits from the input buffer 105 by K bits where K is an input integer to the converting and shifting means 110, and the value of K is to be determined by the processes explained below. The converted and shifted parallel data record is then transferred into a processing data storing means 112 which has the data storage capacity for receiving data from the converting and shifting means 110 for storing up to N bits of data. The processing data storing means 112 thus receives each time in parallel format (represented by the double arrow shown in FIG. 1A), a segment of data containing N bits, which has been shifted K bits to the more significant, to be temporarily stored therein. The method for determining the value of K, an integer ranging from one to N, will be explained below The variable length decoding system 100 further includes a first and a second decoding processing means 115 and 120. The parallel data record, containing N bits of the incoming bit-stream stored in the processing data storing means 112, is then read into the first or the second decoding processing means 115 or 120 depending on the value of a decoding selection input 114. The value of the decoding selection input to the processing data storing means 112 can be either one or two for selecting whether the parallel data record is to be processed by the first or the second decoding processing means 115 or 120. respectively. The method for generating the value of the decoding selection input 114 to the processing data storing means 112 will also be explained below.

The first and the second decoding processing means 115 and 120 each comprises a N-to-$2^N$ decoding means 116 and 121 wherein each of the N-to-$2^N$ decoding means 116 and 121 has a data storage means, e.g., ROM-1 and ROM-2 for storing a first and a second lookup table respectively. The first and the second decoding processing means 115 and 120 each further comprises a signal activation selection bus 117 and 122 each including a plurality of activation data lines. Each of the activation data lines in the signal activation selection buses 117 and 122 is connected to a data bank of a symbol and shift-count outputting port 118 and 123 in the first and the second data processing means 115 and 120 respectively. Each of the outputting ports 118 and 123 further has a data bus 119 and 124 connecting to an output symbol buffer 125 and a shift-count output line 126 and 127 for transmitting a shift-count of K and K' from the first and the second outputting port respectively to the converting and shifting means 110. The first decoding processing means 115 further generates a decoding selection input 114 from the outputting port 119 for inputting to the processing data storing means 112 for selecting whether to transfer the parallel data record in the processing data storing means 112 to the first or the second decoding processing means 115 or 120 respectively.

The first lookup table stored in ROM-1 contains data items of bit length up to N bits representing two types of data items. The first type of data items are the codewords which have bit length equal or less than N bits. The second type of data items which are included in this first lookup table stored in ROM-1 are the bit patterns of the first N bits for these codewords which have bit length greater than N. Assuming $K_c(N)$ is the number of codewords which has bit length less than or equal to N listed in the first lookup table, then the number of data items included in the first lookup table stored in ROM-1 which have codeword length longer than N is $[2^N-K_c(N)]$. The second lookup table stored in ROM-2 includes a third type of data items which represent the remaining bit patterns of the codewords which have codeword length greater than N. Therefore, the first lookup table stored in ROM-1 in the first N-to-$2^N$ decoding means 116 is a table containing $2^N$ data entries and the second lookup table stored in ROM-2 in the second N-to-$2^N$ decoding means 121 is a table containing $2^{M-N}$ data entries.

In carrying out the decoding process, the N-to-$2^N$ decoding means 116 in the first decoding processing means 115 compares the N-bit input from the processing data storing means 112 to each standard codeword listed in the first lookup table stored in ROM-1 in attempt to detect an identical codeword from the N bits of the incoming data stream by matching these N bits with the bit patterns of the data items in the first lookup table stored in ROM-1. As a result of the comparisons made by the N-to-$2^N$ decoding means 116, either a code word is found or a code word is not found. In the case that a codeword is found, i.e., a bit pattern is matched for a K-th data item in the first lookup table where $K≦K_c(N)$, the N-to-$2^N$ decoding means 116 first sets the decoding selection input 114 to one for inputting to the processing data storing means 112 such that next parallel data record stored therein will be inputted to the first decoding processing means 115 at the beginning of next decoding processing cycle. Meanwhile, the N-to-$2^N$ decoding means 116 generates an activation selection signal for selecting an activation lines of the signal activation selection bus 117 which selects one of the data banks in the symbol and shift-count outputting port 118. Then the selected data bank of the symbol and shift-count outputting port 118 transfers two data items. The first data item is a shift-count K, which is the same as the bit length of the matched codeword, for inputting to the shifting and converting means 110 for shifting K bits of the next parallel data record to be stored in the processing data storing means 112 in next decoding processing cycle. The second data item is an output symbol, i.e., the matched codeword, for inputting to an output symbol buffer 125 through an output data bus 119. Additionally, the decoding selection input generated by the N-to-$2^N$ decoding means 116 is also inputted to the output data buffer. A value of one for the decoding selection input, when received by the output data buffer, triggers the completed decoded symbol, i.e., S(K), to be read out to either a display or data storage system (not shown) thus completing the decoding of one codeword. The above processing steps are then repeated again for the decoding of next codeword.

On the other hand, if a codeword is not found, i.e., a bit pattern is matched with a $K_p$-th data item included in the first lookup table where $K_p>K_c(N)$, then a decoding selection input 114 with a value of two is generated by the N-to-$2^N$ decoding means 116 for inputting to the processing data storing means 112 such that the next parallel data record is to be transferred to the second decoding processing means 120. Similarly, the N-to-$2^N$ decoding means 116 generates an activation selection signal for selecting an activation lines of the signal activation selection bus 117 which selects one of the data banks in the symbol and shift-count outputting port 118. Then the selected data bank of the symbol and shift-count outputting port 118 transfers two data items. The first data item is a shift-count K, which equals to N, for inputting to the shifting and converting means 110 for shifting N bits of the next parallel data record to be stored in the processing data storing means 112. The second data item is the first part of an output symbol, i.e., the matched codeword of N bits representing the first N-bits of a codeword longer than N, for inputting to an output symbol buffer 125 through an output data bus 119. Additionally, the decoding selection input 114 with a value of two generated by the N-to-$2^N$ decoding means 116 is also inputted to the output data buffer. A value of two for the decoding selection input 114, when received by the output data buffer, triggers the first part of the decoded symbol, i.e., S'(K), to be stored in the output buffer 125 waiting for the completion of the decoding process to be performed by the second decoding processing means 120.

When a codeword is not found and the shifting and converting means 110 receives a shift count of N, a new set of N bits are now read into the processing data storing means 112. Among these N bits of the parallel data record in the processing data storing means 112, (M–N) bits are received by the second decoding processing means 120 since the decoding selection input 114 is set to two. The N-to-$2^N$ decoding means 121 compares these (M–N) bits with the bit patterns listed in the second lookup table stored in ROM-2. Since the codeword to be determined is longer than N, this (N-M) are processed to find a match between the input bits and the remaining bits listed in the second lookup table in ROM-2. When a matched bit pattern is found which has K' bits, where K'≦(M–N), from the second lookup table in ROM-2, the N-to-$2^N$ decoding means 121 then performs identical processes by using the signal activation selection bus 122 and symbol and shift count output port 123 to generates shift count K' for inputting to the shifting and converting means 110. Meanwhile, a second part of an out put symbol is generated for inputting to the output buffer 125 via an output symbol data bus 124. The second part of the output symbol generated from the second decoding processing means 120 is combined with the first part of the output symbol generated by the first decoding processing means 115 to become a complete decoded output symbol. The complete decoded output symbol S(N+K') which contains N+K' bits is then read out to either a display or data storage system (not shown) thus completing the decoding of one codeword. The above processing steps are then repeated again for the decoding of next codeword.

By the use of two lookup tables in ROM-1 and ROM-2, a saving of memory space for data storage and associated hardware elements such as the signal activation selection buses 117 and 122 and the outputting ports 118 and 123 is accomplished. The lookup tables in ROM-1 and ROM-2 are smaller than that used for a single lookup table decoder. A saving in the amount of $[2^M W-(2^N W +2^{M-N} W)]$ bits is achieved, where W is the word width in bits of the lookup table, since in a conventional decoder using a single lookup table, a data storage for $(2^M)W$ bits is required when there are $(2^M)$ entries of dictionary codewords and each codeword has a bit-length of W. While the total number of bits required for storing the first lookup table in ROM-1 is $(2^N)W$ and the total number of bits required for storing the second lookup table in ROM-2 is $(2^{M-N})W$. Meanwhile, with less number of bits in the lookup tables, the sizes and bit-width required for the signal activation selection buses 117 and 122 and the outputting ports 118 and 123 are also smaller, easier to design and occupy less space.

Figure 1B:
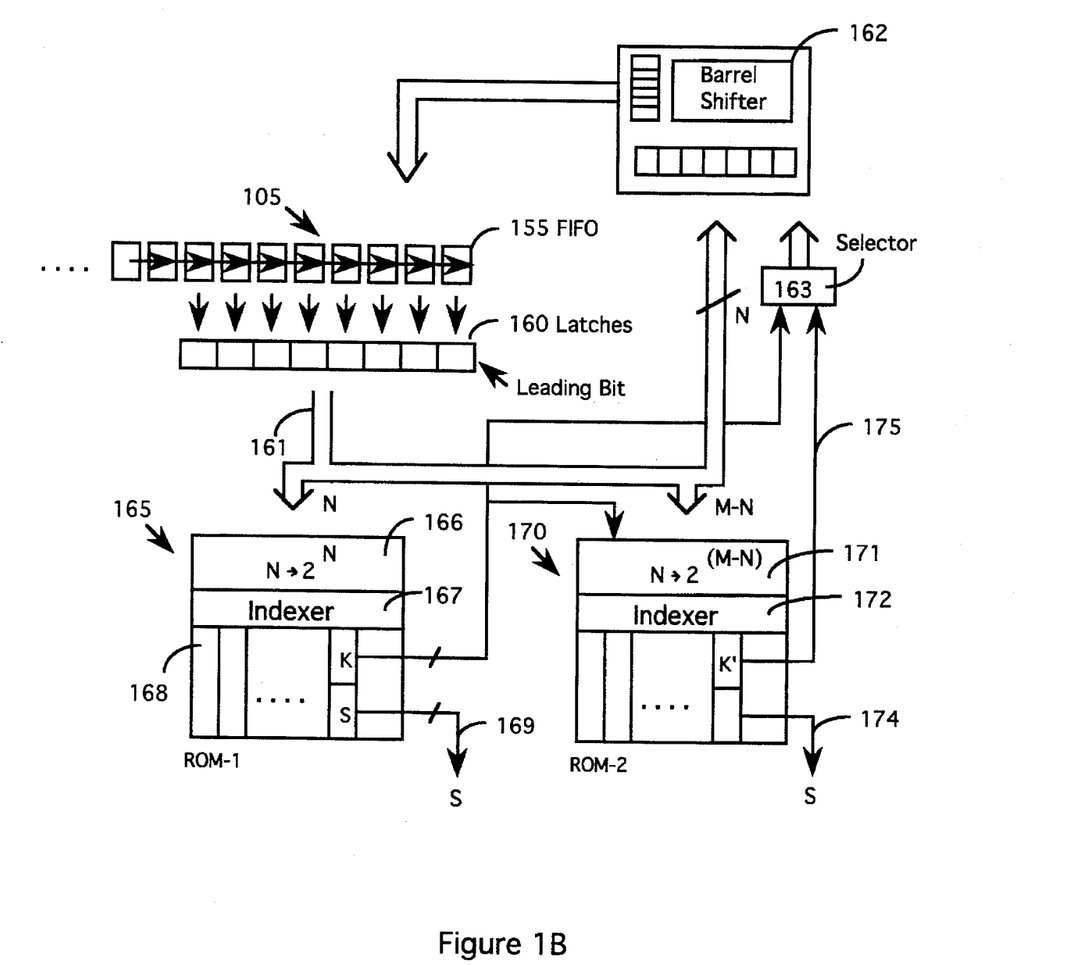
FIG. 1B is a functional block diagram of an alternate preferred embodiment of a decoding system of the present invention.
Figure 1C:
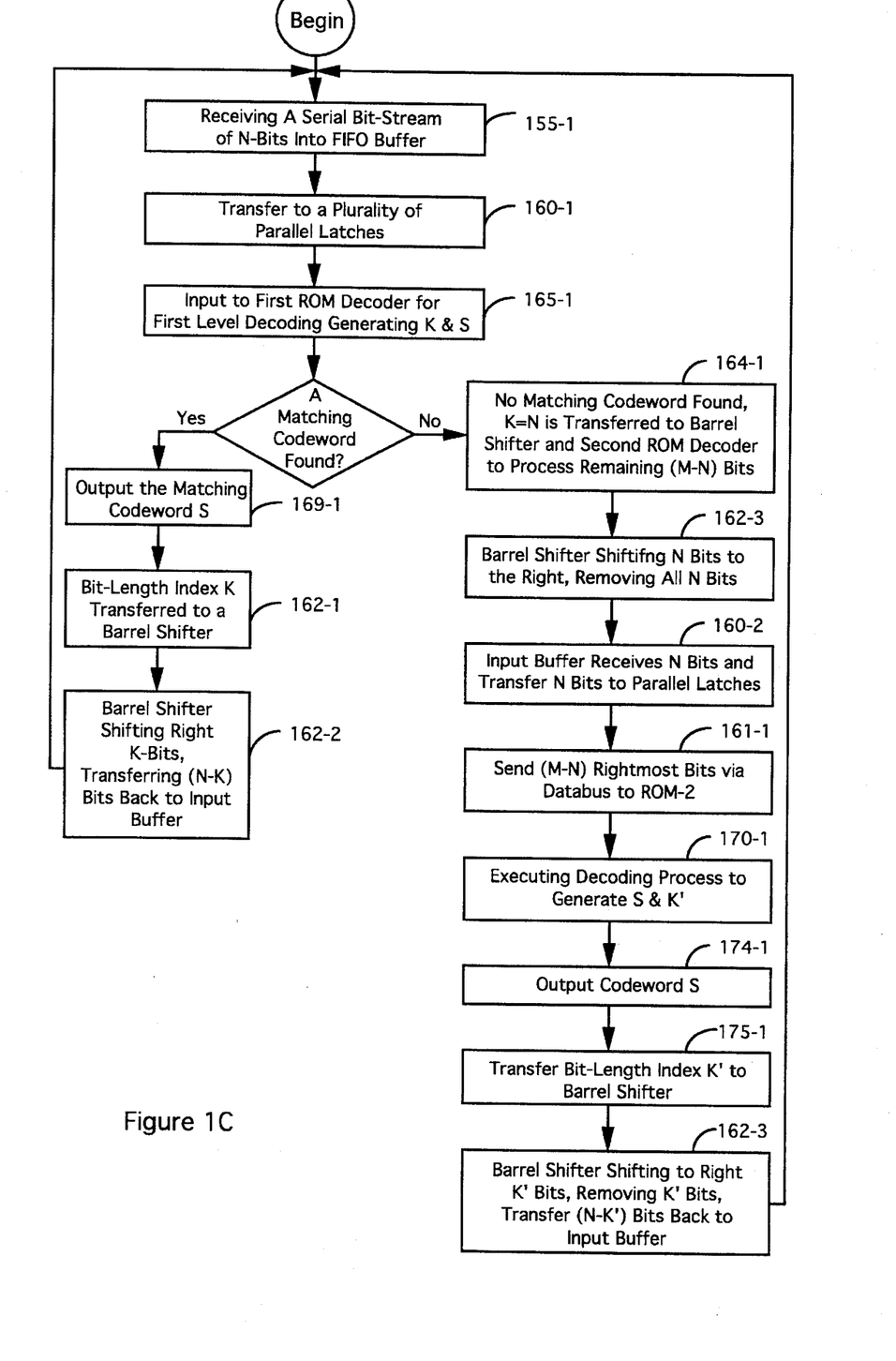
FIG. 1C is a flow chart showing the processing steps performed by the decoding system of FIG. 1B.

FIG. 1B is a functional block diagram of an alternate preferred embodiment, i.e., a variable length decoding system 150, of the present invention and FIG. 1C shows in a flow chart, the processing steps carried out by the decoding system as shown in FIG. 1B. The decoding process begins (step 150-1) by receiving a serial bit stream of N bits into a FIFO buffer 155 (step 155-1). These N bits are then transferred to a plurality of parallel latches 160 (step 160-1) thus carrying out a serial-to-parallel conversion wherein the serial bit stream received by the buffer 155 is now converted into parallel N bits stored in the parallel latches 160. These parallel N bits are transferred from the latches 160, via a data bus 161, to a first ROM decoder 165 wherein a first level decoding is performed (step 165-1). The first ROM decoder 165 includes a N-to-$2^N$ processing means 166 which compares the N bits received from the parallel latches 160 with the $2^N$ codewords stored therein in order to find a match. In the case when a match with a codeword of K bits is found, an index means 167 assigns an index i pointing to a corresponding table entry in a data array table 168 wherein the table entry identifying a pair of data items. The first data item is a bit-length index representing the bit length of the matching codeword, and the second data item is the codeword itself, i.e., $S_1 S_2 S_3$. . . , which is generally referred to as a 'symbol'. Depending on the result of the codeword matching as performed in step 165-1, a selection is made (step 165-2) wherein when a match codeword is found, path A is selected. The codeword, i.e., the symbol, is outputted from an output port 169 (step 169-1) and meanwhile, the bit-length index K is transferred from a bit-length data line 164 via a select means 163 to a barrel shifter 162 (step 162-1). The barrel shifter 162 then removes these K bits by shifting right and transferring back the remaining (N–K) bits into the input buffer 155 (step 162-2). A codeword is found, i.e., branch C, and a returning to step 155-1 is carried out to repeat the entire process to find out the next codeword.

On the contrary, if a matching codeword is not found for the first N bits in step 165-2, selection B is made to continue the search of a codeword by the comparing of the remaining (M–N) bits. The bit-length index K can be set at a value of zero or any value that is greater than N which will be transferred to the barrel shifter 162 to initiate a right shift of N bits to eliminate all N bits (step 162-3). The input buffer 155 then receives an entire set of N bits and transferring these N bits into the parallel latches 160 (step 160-2). The parallel latches 160 then transfers the rightmost (M–N) bits via the data bus 161 (step 161-2) to the second ROM decoder 170 for decoding process. The system configuration and decoding processes performed by the second ROM decoder 170 are similar to that of the first ROM decoder 165. The second ROM decoder 170 includes a (M–N)-to-$2^{(M-N)}$ processing means 171 which compares the (M–N) bits received from the parallel latches 160 with the $2^{(M-N)}$ codewords stored therein which represent the bit patterns of the remaining (M–N) bits for these codewords which have bit length longer than N. The second ROM decoder 170 performs the comparisons (step 170-1) in order to match the (M–N) bit of the input stream with one of the $2^{(M-N)}$ bit patterns to find out a match codeword in combination with the first N bits processed by the first ROM decoder 165. When a matching pattern is found, an index means 171 assigns an index i pointing to a corresponding table entry in a data array table 172 wherein the table entry identifying a pair of data items. The first data item is a bit-length index representing the bit length of the matching pattern K', and the second data item is the matched pattern itself, i.e., $S_1 S_2 S_3 \ldots S_{2(M-N)}$, which is generally referred to as a 'symbol'. The matched bit pattern, i.e., the symbol is outputted from an output port 174 (step 174-1) and meanwhile, the bit-length index K' is transferred from a bit-length data line 175 via a select means 163 to a barrel shifter 162 (step 175-1). The barrel shifter 162 then removes these K' bits by shifting right and transferring back the remaining (M−N−K') bits into the input buffer 155 (step 162-3). A codeword of bit length (N+K') is found by combining the symbols found by the second ROM decoder with the first N-bit, i.e., branch D, and a returning to step 155-1** is carried out to repeat the entire process to find out the next codeword.

Figure 1D:
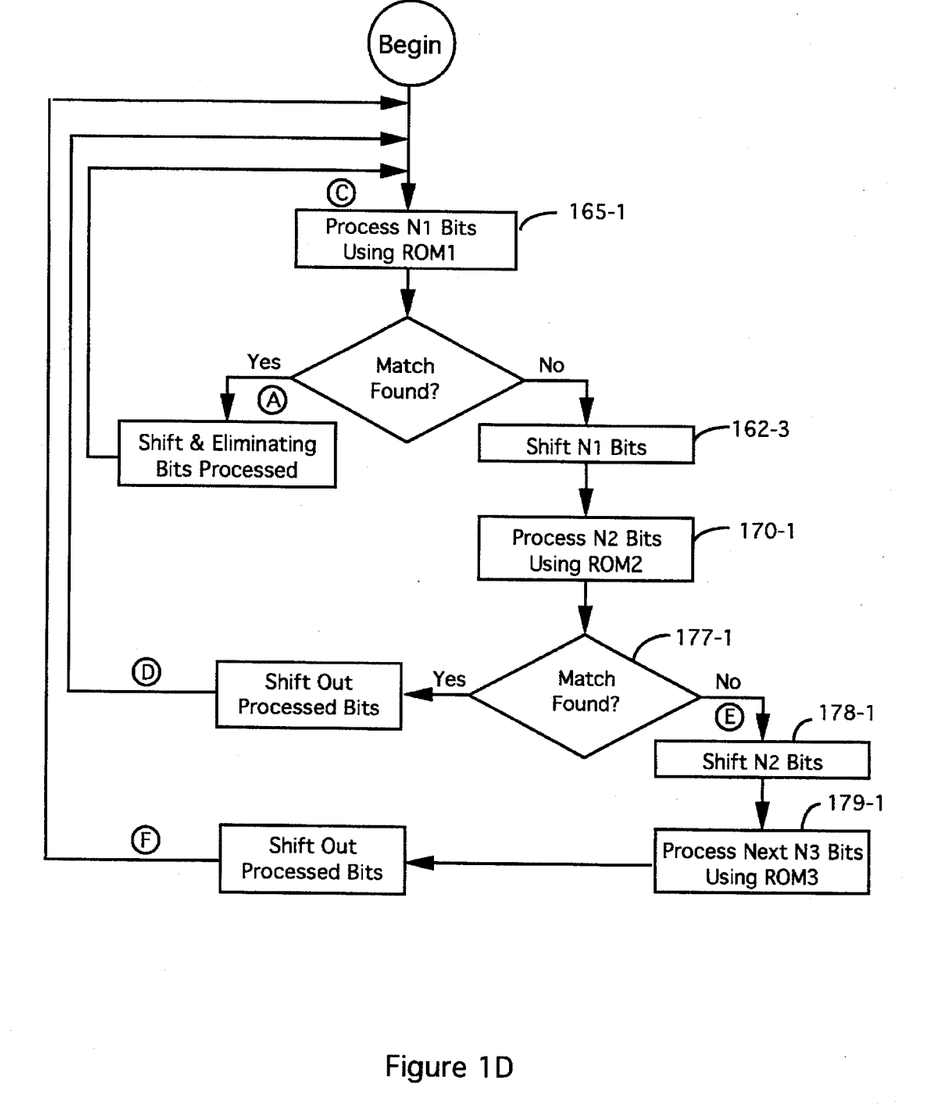
FIG. 1D is a flow chart showing the processing steps performed by a three-level decoding system of the present invention.

According to the general design principle described above, a variable length decoder can be designed to become a three-layer, four layer or multiple-layer decoder. A flow chart is used in FIG. 1D to show the processing steps carried out by a three layer decoder applying the multi-layer decoder structure of the present invention. The processes and tasks performed in the steps 165-1, 162-1, 162-3, and 170-1 by the first and the second level of decoders as includes in FIG. 1D are the same as that described in FIG. 1C. In step 177-1, if a match of bit pattern is found by the use of the second ROM decoder, the steps carried out by this three-level decoder is the same as a two level decoder as that discussed in FIGS. 1B and 1C. If a bit-pattern match is not found in the second ROM decoder, the barrel shifter removes the rightmost N2 bits from the input buffer (step 178-1). A third ROM decoder is applied to perform a bit-pattern match for the remaining (M−N$_1$−N$_2$) bits. While the steps 179-1, i.e., matching the bit pattern for the remaining bits, and step 180-1, i.e., removing the processed bits by shifting, are the same as those performed by the steps performed in the steps 170-1, 171-1, or the steps 175-1 and steps 162-2.

Based on the multi-level structure of the present invention, the number of levels used for a variable length decoder can be determined based on the length of the codewords, the data storage capacity and the processing speed requirement. As a general guideline, for a two level decoder, in order to minimize the data storage requirement, the bit length of the first decoder, i.e., N, is set to be about half of the maximum bit length, i.e., N=(M/2). Because of the advantages provided by this multi-level structure, the decoder of the present invention can be flexibly designed to fit different data storage capacity, various processing speed requirements and codewords of different maximum lengths.

Figure 2:
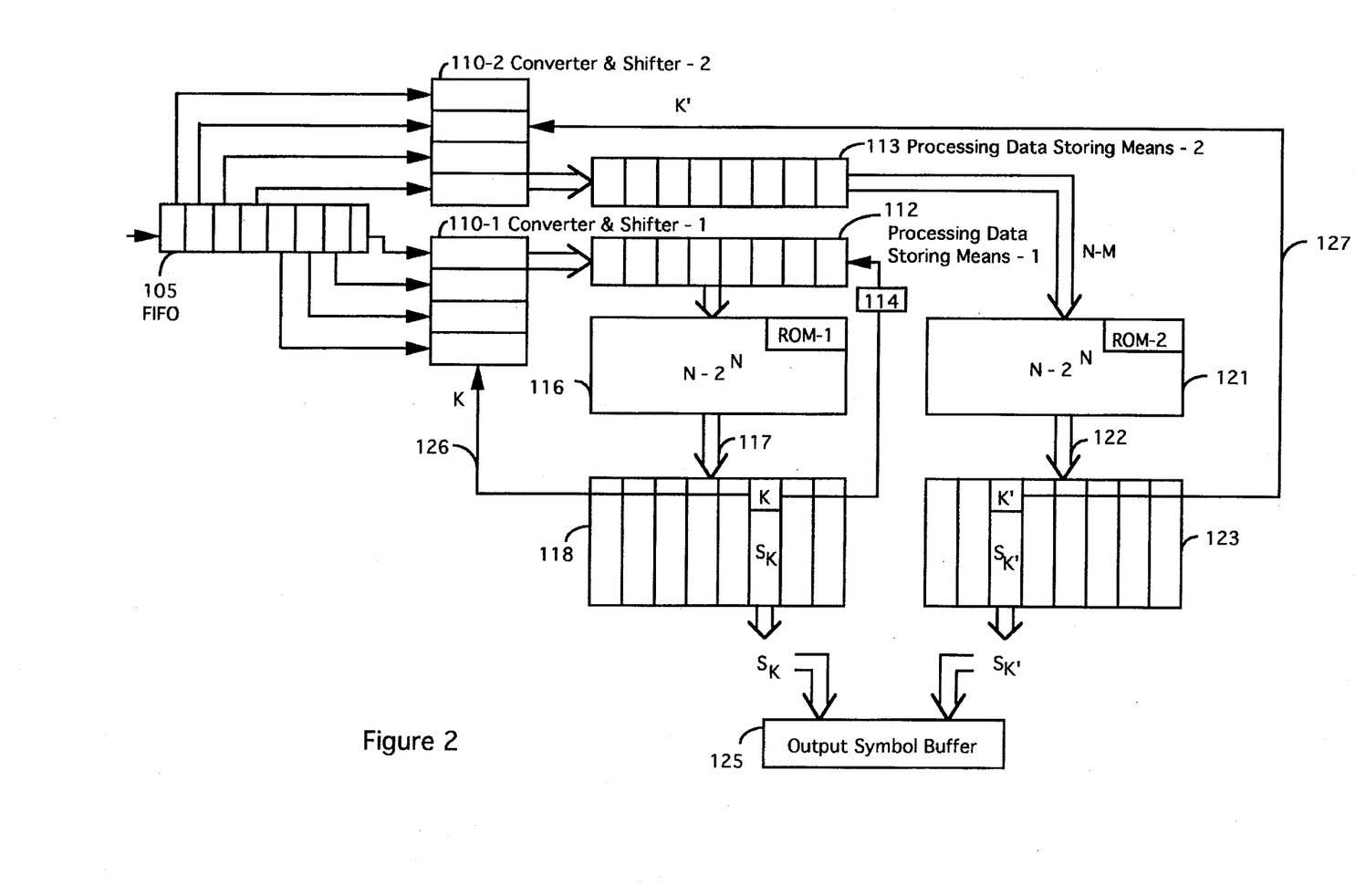
FIG. 2 is a functional block diagram of another decoding system in accordance with the present invention.

FIG. 2 shows an alternative preferred embodiment of the present invention wherein every element is identical as that shown in FIG. 1A except that 1) the serial to parallel shifting and converting means including a first and second converting means 110-1 and 110-2 wherein the first converting means 110-1 manages the shifting and converting of up to N bits and the second converting means shifts and converts up to (M−N) bits, and 2) a second processing storing means 113 of (M−N) is added. The first and the second shifting and converting means 110-1 and 110-2 manage the shifting and converting in sequential order of up to N bits and (M−N) bits of incoming bit stream to transfer two parallel data records for inputting to the first and second processing data storing means 112 and 113 respectively.

The first decoding processing means 115 compares the N-bit input from the first processing data storing means 112 to each data item in the first lookup table stored in ROM-1 in attempt to detect a codeword from the N bits of the incoming data stream by matching these N bits with the bit patterns of the data items in the first lookup table. Meanwhile, the second decoding processing means 120 compares the (M−N) bit input from the second processing data storing means 113 to each data item in the second lookup table stored in ROM-2 in attempt to detect a match between the M−N bits from the incoming data stream with the bit patterns of the data items in the second lookup table.

In this second preferred embodiment, the first decoding processing means 115 performs all the identical steps as that performed by the first decoding processing means 115 described in FIG. 1A. The only difference is that when a codeword is found, the first decoding processing means 115 including the N-to $2^N$ decoding means 116 in addition to sending the decoding selection input 114 with a value of one to the processing data storing means 112 and the output data buffer 125, the decoding selection input 114 is also sent to the second decoding processing means 120. The decoding selection input with a value of one when received by the second decoding processing means 120 terminates the parallel process by the second decoding processing means 120 in comparing the (M−N) bits in the incoming bit stream with the second lookup table stored in ROM-2. The whole process of bit shifting and refilling of the first and second processing data storing means 112 and 113 are then performed as what has been described for the preferred embodiment as provided in FIG. 1A and a new decoding cycle is then initiated.

In case that a codeword is not found, the first N bits of a codeword which has a length L, where L>N is matched with a bit pattern in the first lookup table stored in ROM-1 identified as J-th entry in the first lookup table, where $J=K_c(N), K_c(N)+1, \ldots R$ and $R=2^{(M-N)}$ represents the total number of codewords which have the codeword length greater than N. In the meantime, the process of comparing the M−N bits with the second lookup table being carried out in parallel. The second lookup table stored in ROM-2 has an additional entry of (M−N) bits at the end of each data item to identify which bit pattern, i.e., j where $j=K_c(N), K_c(N)+1, \ldots R$, this data entry is associated with for the data entries included in the first lookup table. Therefore, each data entry in the second lookup table is associated with a bit pattern in the first lookup table by the use of an index J of (M−N) bit attached at end of each data entry of the second lookup table. In addition to matching the bit patterns of the (M−N) bits with the data entry in the second lookup table, when a match is found, the second decoding processing means 120 also checks if a match is also found of the J index between the first and the second lookup tables. A symbol is generated soon as the match is found.

Again, assuming the bit length of the code word found is N+K', where K'≦(M−N) is the number of bits found from the second lookup table stored in ROM-2, the value K' is then inputted to the second shifting and converting means 110-2 to shift K' bits for the data stored in the first processing data storing means 112, shift K' bits for the data to be stored in the second processing data storing means 113. After the operations performed by the first and the second shifting and converting means 110-1 and 110-2, the first processing data storing means 112 is filled with M-(N+K') remaining bits which have been left originally in the second processing storing means 113. The rest of the bit locations in the first and the second processing data storing means 112 and 113 are now filled with new sets of bits from the input data buffer 105 to be simultaneously processed by the first and the second decoding processing means 115 and 120.

Therefore, by utilizing the first and the second processing data storing means 112 and 113, parallel processing of bit pattern comparisons are carried out for the determination of the codeword which matches one of the bit patterns as listed in the first and the second lookup tables stored in ROM-1 and ROM-2 respectively. Not only the memory space is saved because the total memory space for the required data tables, i.e., $2^N$ entries of N bits of data and $2^{(M-N)}$ entries of 2(M–N) bits of data, is much smaller than that required in the prior art, i.e., $2^M$ entries of M bits of data, the processing time is also saved because the parallel processing performed by the use of two lookup tables simultaneously.

Figure 3:
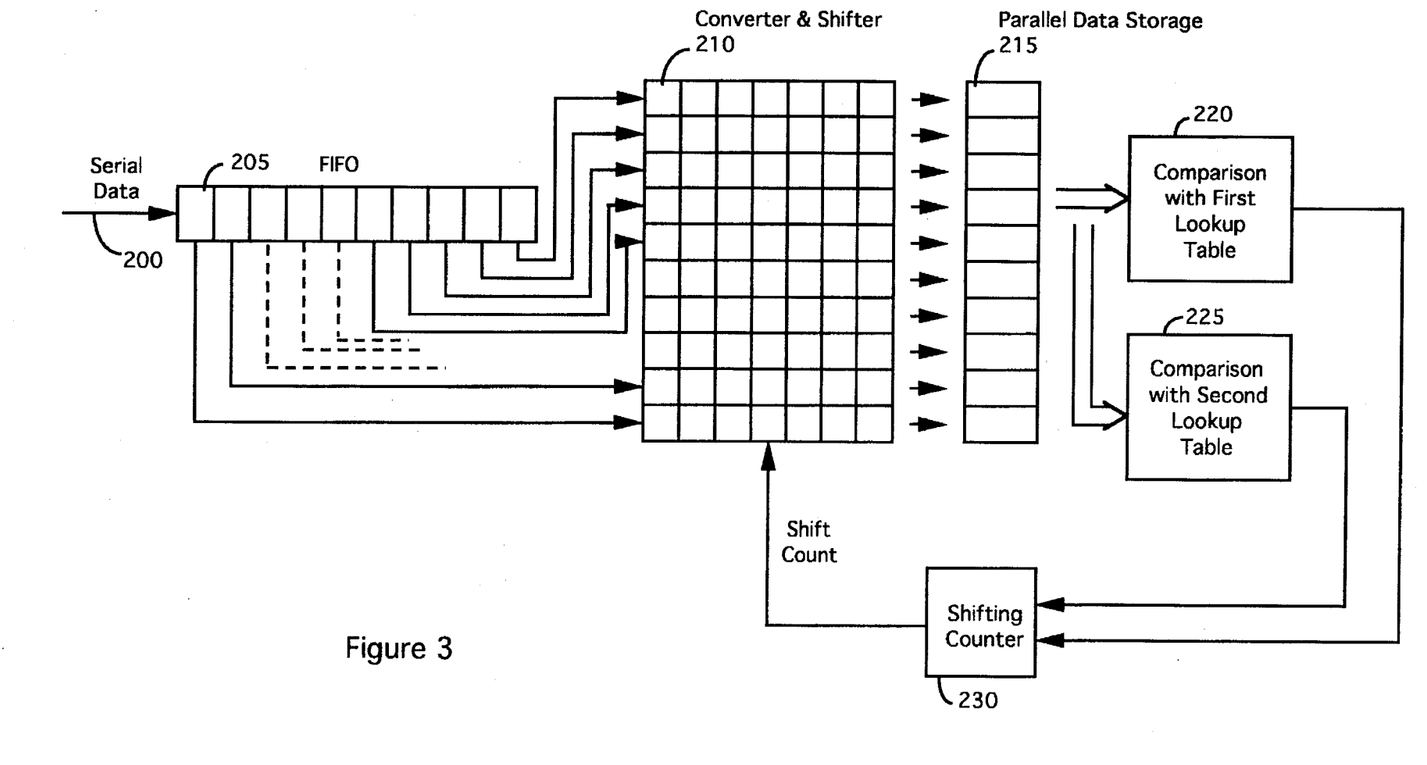
FIG. 3 is a block diagram showing the essential functional processes and data flow of the present invention

FIG. 3 is a block diagram showing the essential functional processes and data flow of the present invention. The incoming data stream 200 is received by a first-in-first-out (FIFO) register 205 in serial format. A plurality of bits from this FIFO register 205 are then inputted into a serial to parallel converting and shifting means 210 which is preferably a Barrel shifter for the present invention to convert the serial data into a data record 215 in parallel format. The parallel data record 215 is then processed by comparing with the bit patterns in the first lookup table (step 220) and comparing with the second lookup table (step 225) for the determination of a codeword. The results of the decoding processes, i.e., steps 220 and 225, then inputted to a shift counter 230 to determine a shift count K, i.e., the number of bits to be shifted. The shift count K generated by the shift counter 230 is then inputted to the serial to parallel converting and shifting means 210 to perform the serial to parallel conversion and bit-shifting operations. The decoding processing steps, i.e., steps 220 and 225, are then repeated.

The present invention thus discloses an apparatus for decoding an ordered sequence of incoming binary bit-stream in serial containing a plurality of variable length codewords with a maximum codeword length of M. The decoding apparatus comprises a serial to parallel converting and shifting means for receiving the incoming bit stream, and for receiving a shift-count for shifting and converting the shift-count number of bits for adding to a parallel data record. The decoding apparatus further comprises a dictionary means including at least two dictionary tables for listing a plurality of standard codewords wherein each of the dictionary tables having a bit-length less than M. The decoding apparatus further comprises a decoding means for decoding the parallel data record by utilizing the dictionary means and to generate the shift-count as an input to the serial to parallel converting and shifting means.

By the use of the serial to parallel converting and shifting means 210, the speed of the decoding is improved wherein multiple bits are processed in parallel in one clock cycle in the operations of data shifting and decoding. Additionally, by the use of the multi-layered lookup decoding tables, the data storage requirement is reduced wherein the size of the lookup tables and the sizes of the Barrel sifter are reduced. The major difficulties encountered in the prior art are therefore resolved by the use of the decoding system as disclosed in the present invention.

Figure 4:
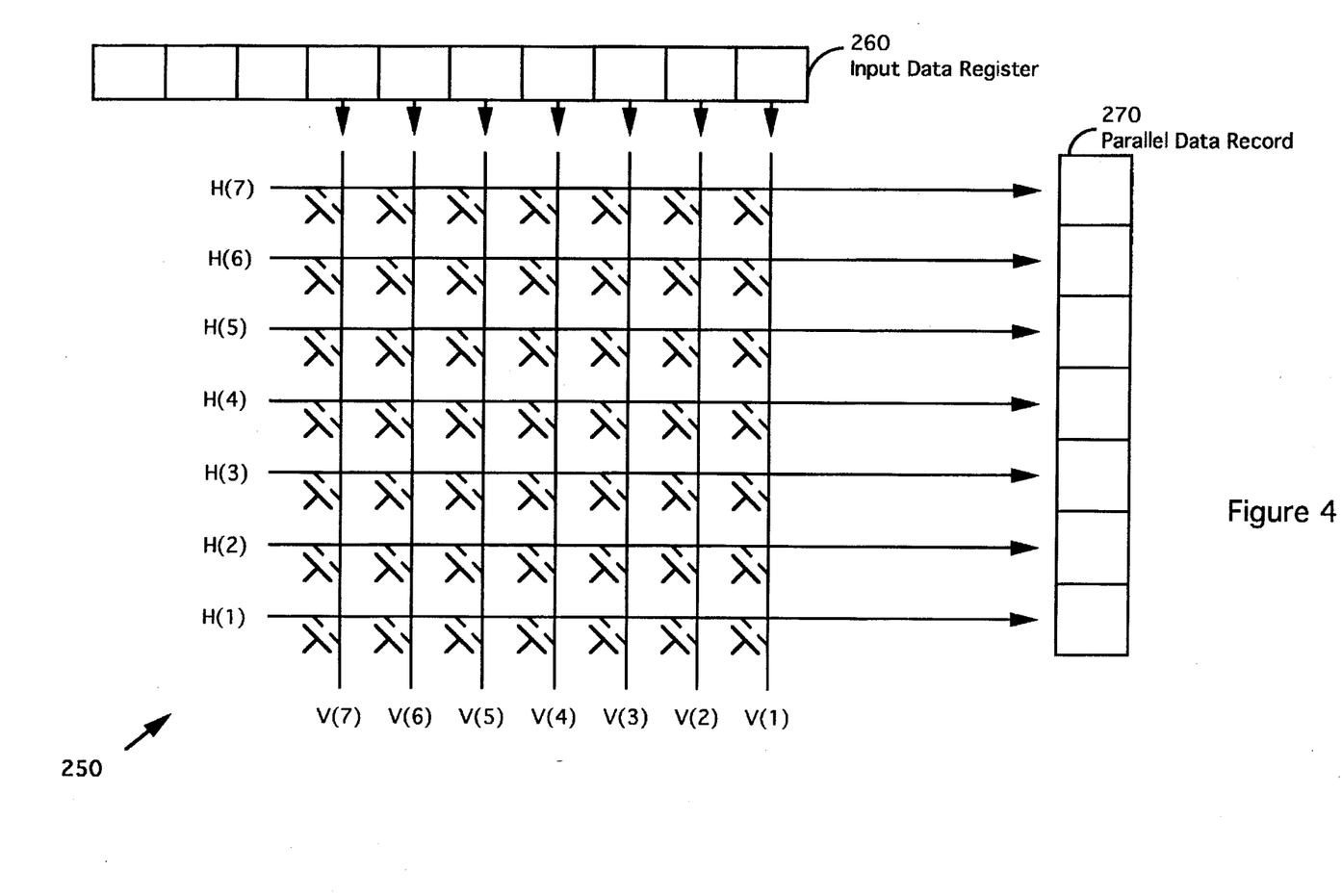
FIG. 4 shows the circuit connections of a Barrel shifter to a first in first out input data register.

FIG. 4 shows circuit connections of a Barrel shifter 250 to an input data register 260 wherein the encoded input data are received and stored in a serial format. Each bit of the input data register 260 is connected to a vertical input line V(1), V(2), V(3), ... V(N) of the shift register 250 where N<M. For the purpose of illustration, N is set to be 7. For each horizontal input line, the Barrel shifter also includes a corresponding vertical output line V(1), V(2), V(3), ... V(N). There is a shift-switch at each intersection of a vertical input line and a horizontal output line. The function of the Barrel shifter 250 is carried out where the switches along each diagonal lines connecting these intersections of the horizontal and vertical lines are operated synchronously. For example, for a shift-count of zero, the switches on the intersections of V(1)-H(1), V(2)-H(2), ..., V(7)-H(7) are turned on by a single diagonal switch such that H(1)=V(1), H(2)=V(2), ... H(7)=V(7) and the serial data is now converted to a parallel data record output 270. Similarly, for a shift-count of k, the switches on the intersections of V(1+k)-H(1), V(2+k)-H(2), ... V(7)-H(7–k) are turned on such that H(1)=V(1+3), H(2)=V(2+3), H(3)=V(3+3), H(4)= V(4+3) when the shift count is 3. Meanwhile, once the last bit, i.e., V(7) of the data in the input register 260 is read into the Barrel shifter 250, the input data register 260 is now replenished with data bits of V(8),V(9), V(10), ... V(14). Also, the switches on the diagonal intersections of V(1)-H(N–k), V(2)-H(N–k+1), ... V(k)-H(N–1) are turned on such that H(5)=V'(1)=V(8), H(6)=V'(2)=V(9), H(3)=V'(3)= V(10) when k=3 and N=7. By the use of the Barrel shifter 250, the serial bit stream in the input data register 260 is converted and shifted into a parallel data record 270. Since the size of the first lookup table N is smaller than M, the size of the Barrel shifter is reduced by a proportion of $(M^2-N^2)$. The hardware space occupied by the Barrel shifter required to perform the serial to parallel conversion and shift operations is therefore reduced.

Figure 5:
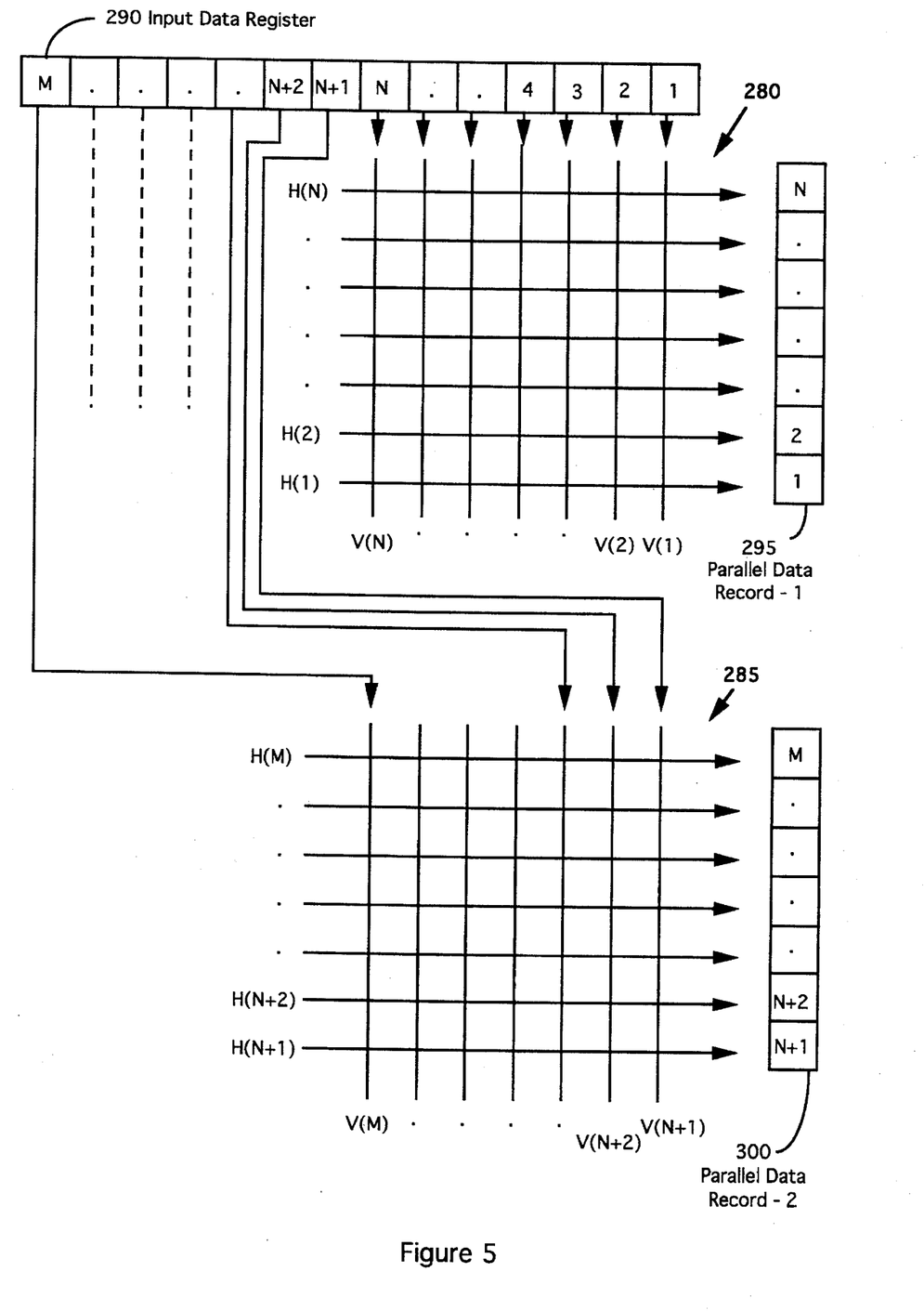
FIG. 5 shows the circuit connections of two smaller Barrel shifters to an input data register for providing parallel data records to two processing data storing means.

FIG. 5 shows two Barrel shifters 280 and 285 used to receive serial data input from a input data register 290 of M bits wherein the first N bits are used by the first Barrel shifter 280 to generate a first parallel data record 295 to be stored in the first processing data storing means 112 in FIG. 2 and the last (M–N) bits are used by the second Barrel shifter 285 to generate a second parallel data record 300 to be stored and parallel processed in the second processing data storing means 113 in FIG. 2. The purpose of using two Barrel shifter is to allow parallel decoding process to be performed by the use of the first and the second lookup tables to expedite the decoding process without requiring to increasing the size of the Barrel shifter to a dimension of $M^2$. It is to be noted that the input data register 290 is a register which is able to retain the bit pattern stored therein after the bit pattern is inputted to the first and the second Barrel shifter 280 and 285. The bit pattern of the register 290 is retained until the bits are shifted by the number of shift bits, i.e., K and K', as described above. The size of the hardware and the speed of decoding can be optimized by adjusting the size of N such that the speed requirement is satisfied without excessively increasing the size of the decoding apparatus and sacrificing the portability feature if necessary.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An apparatus for receiving and decoding an ordered sequence of serial binary bit-stream containing a plurality of variable length codewords with a maximum codeword length of M, said decoding apparatus comprising:

a serial to parallel converting and shifting means having a first-in-first-out (FIFO) buffer for receiving said serial bit stream, said serial to parallel converting and shifting means further includes a plurality of parallel latches for receiving a shift-count for shifting and converting said shift-count number of bits from said serial bit stream to a parallel data record of M bits;

a dictionary means including at least two read-only-memory (ROM) decoders represented by D(i), where i representing a positive integer and $I \geq i \geq 1$ where $2 \leq I \leq M$, each of said D(i) including a ROM(i) for listing a plurality of standard codewords (CWs) and a bit length of each codeword BL(CW) wherein each of said ROM(i) having a bit-length of L(i) which being less than M, each of said ROM-decoders D(i) further includes a L(i)-to-$2^{L(i)}$ processing means P(i) for receiving a partial bit-stream BS(i) having a bit-length of L(i) from said parallel latches, said processing means P(i) further comparing said partial bit-stream BS(i) with each of said codewords (CWs) stored in said ROM(i) to find a match;

each of said ROM-decoders D(i) further includes an index means for generating a ROM-index ROM-j when a match between said partial bit stream BS(i) and a codeword (CW-j) stored in said ROM(i) is found;

an output port for outputting said codeword CW-j and a bit length BL(CW-j) of said codeword CW-j; and a barrel shifter connected to said FIFO buffer and parallel latches for receiving said bit-length BL(CW-j) and for shifting said binary serial bit stream for decoding.

2. The decoding apparatus of claim 1 wherein:

said ROM decoders D(i) decodes said parallel data record in a sequential order of i=1, 2, 3, 4, ..., I, and starting from i=1 again when a match between said partial bit stream BS(i) and a codeword (CW-j) stored in said ROM(i) is found and BL(CW-j)<L(i).

3. The decoding apparatus of claim 2 wherein:

said dictionary means including two read-only-memory (ROM) decoders D(1) and D(2) each including a ROM represented by ROM(1) and ROM(2) for listing a plurality of standard codewords (CWs) wherein each of said ROM(1) and ROM(2) having a bit-length of L(1) and L(2) respectively wherein L(1) is approximately half of the maximum bit length M, and L(1)+L(2)=M.

4. The decoding apparatus of claim 3 wherein:

said dictionary means further includes a parallel processing means for managing said D(1) and D(2) decoders to perform a comparison of said partial bit-stream BS(1) and BS(2) with said codewords stored in said ROM(1) and ROM(2) respectively in parallel.

5. A method for decoding an ordered sequence of serial binary bit-stream containing a plurality of variable length codewords with a maximum codeword length of M, said method comprising steps of:

(a) receiving said bit-stream into a FIFO buffer of N bits where N is a positive integer and $N \leq M$;

(b) transferring said bit-stream into a plurality of parallel latches for converting said bit-stream into a parallel bit-stream;

(c) transferring BL(i) rightmost bits of said parallel bit-stream to an i-th ROM decoder D(i), where BL(i) represents bit-length of said D(i) and $BL(i) \leq N$, starting with i=1 and i is then increased one-by-one incrementally to an integer I where $I \leq M$, and BL(1)+BL(2)+...BL(I)=M, (d) comparing said parallel-bit-stream of bit-length BL(i) transferred to said ROM decoder D(i) with a plurality of codewords CWs stored in a ROM(i) for generating a matched codeword MCW-i and a matched bit-length BL(MCW–i) of said matched codeword MCW-i when a match is found between one of said CWs and said parallel bit-stream;

(d) generating an output including said MCW-i and said matched bit-length BL(MCW–i) of said matched codeword;

(e) if said BL(MCW–i) is less than BL(i), generating a complete codeword by combining each of said matched codeword MCW-i with a bit-pattern as (MCW–i)(MCW–i–1) ... (MCW–2)(MCW–1), resetting i=1 to start decoding a new complete codeword beginning with a first ROM decoder D(1) in said step (b);

(f) applying said matched bit-length BL(MCW–i) to shift said FIFO buffer by BL(MCW–i) bits to the right; and (f) repeating steps (b) to (e) if a new bit-stream is received by said FIFO.

6. The method for decoding said bit stream as recited in claim 5 wherein said step (c) of transferring BL(i) rightmost bits of said parallel bit-stream to an i-th ROM decoder D(i), starting with i=1 and i is then increased one-by-one incrementally to an integer I:

where I=2, and where said bit-length BL(1) of said decoder D(1) is approximately half of the maximum bit length of said codewords M, wherein BL(1)+BL(2)=M.

7. The decoding method as recited in claim 6 wherein:

said step (c) of transferring BL(i) rightmost bits of said parallel bit-stream to an i-th ROM decoder D(i) is a step of transferring BL(1) rightmost bits of said parallel bit-stream to said ROM decoder D(1) and remaining bits to said ROM decoder D(2); and said step (d) of comparing said parallel bit-stream of bit-length BL(i) transferred to said ROM decoder D(i) with a plurality of codewords CWs stored in a ROM(i) for generating a matched codeword MCW-i and a matched bit-length BL(MCW–i) of said matched codeword MCW-i when a match is found between one of said CWs and said parallel bit-stream is a step of applying a parallel processing means for comparing said parallel bit-stream in said D(1) and D(2) in parallel for generating said MCW-i and BL(MCW–i).

* * * * *